United States Patent
Luo et al.

(10) Patent No.: US 11,881,813 B2
(45) Date of Patent: Jan. 23, 2024

(54) MODULE SWITCHOFF DEVICE AND SECURITY PROTECTION SYSTEM OF PHOTOVOLTAIC POWER GENERATION SYSTEM

(71) Applicant: ZHEJIANG YINGDAWEIXIN ELECTRONIC CO., LTD., Zhejiang (CN)

(72) Inventors: Yuhao Luo, Zhejiang (CN); Dongming Zhou, Zhejiang (CN)

(73) Assignee: ALTENERGY POWER SYSTEM INC., Zhejiang (CN)

( * ) Notice: Subject to any disclaimer, the term of this patent is extended or adjusted under 35 U.S.C. 154(b) by 75 days.

(21) Appl. No.: 17/625,737

(22) PCT Filed: Aug. 6, 2019

(86) PCT No.: PCT/CN2019/099364
§ 371 (c)(1),
(2) Date: Jan. 8, 2022

(87) PCT Pub. No.: WO2021/003790
PCT Pub. Date: Jan. 14, 2021

(65) Prior Publication Data
US 2022/0294389 A1 Sep. 15, 2022

(30) Foreign Application Priority Data
Jul. 9, 2019 (CN) .......................... 201910615186.4

(51) Int. Cl.
*H02H 3/00* (2006.01)
*H02S 40/34* (2014.01)
(Continued)

(52) U.S. Cl.
CPC ............... *H02S 40/34* (2014.12); *H02H 3/20* (2013.01); *H02H 7/20* (2013.01); *H03K 17/567* (2013.01)

(58) Field of Classification Search
None
See application file for complete search history.

(56) References Cited

U.S. PATENT DOCUMENTS

| 11,190,021 B2 * | 11/2021 | Moslehi ..................... G05F 1/67 |
| 2015/0061409 A1 * | 3/2015 | Dunton .............. H03K 17/7955 307/115 |

(Continued)

FOREIGN PATENT DOCUMENTS

| CN | 101707450 A | 5/2010 |
| CN | 106981881 A | 7/2017 |

(Continued)

OTHER PUBLICATIONS

International Search Report for PCT/CN2019/099364 dated Apr. 3, 2020, ISA/CN.

*Primary Examiner* — Stephen W Jackson
(74) *Attorney, Agent, or Firm* — Yue (Robert) Xu; Apex Attorneys at Law, LLP

(57) ABSTRACT

A module switchoff device and a security protection system of a photovoltaic power generation system. The module switchoff device comprises: a switch tube having a first end connected to a positive input end of the module switchoff device and a second end connected to a negative input end of the module switchoff device, the positive input end and the negative input end of the module switchoff device being connected to a photovoltaic module; a driving module connected to a control end of the switch tube; and a power supply module connected to the driving module and an output end of the module switchoff device, the output end of the module switchoff device being connected to a controller (Continued)

used for controlling the switch tube to be switched off when there is a need for the photovoltaic module to normally output a voltage and controlling the switch tube to be switched on when there is no need for the photovoltaic module to output a voltage, and the power supply module being used for converting a control signal of the controller.

18 Claims, 6 Drawing Sheets

(51) Int. Cl.
    *H02H 3/20*         (2006.01)
    *H02H 7/20*         (2006.01)
    *H03K 17/567*     (2006.01)

(56) References Cited

U.S. PATENT DOCUMENTS

| | | | |
|---|---|---|---|
| 2016/0126367 A1* | 5/2016 | Dunton | H03K 17/687 |
| | | | 307/115 |
| 2017/0207620 A1 | 7/2017 | Zhu et al. | |
| 2020/0067452 A1* | 2/2020 | Yang | H02J 3/388 |
| 2020/0091706 A1 | 3/2020 | Yang et al. | |

FOREIGN PATENT DOCUMENTS

| | | | |
|---|---|---|---|
| CN | 108832893 A | 11/2018 | |
| CN | 109038669 A | 12/2018 | |
| CN | 109066798 A | 12/2018 | |
| CN | 208479192 U | 2/2019 | |
| CN | 109474020 A | 3/2019 | |
| CN | 109818567 A | 5/2019 | |
| EP | 2675035 A1 | 12/2013 | |

* cited by examiner

MODULE SWITCHOFF DEVICE AND SECURITY PROTECTION SYSTEM OF PHOTOVOLTAIC POWER GENERATION SYSTEM

The present application is a National Stage application of PCT international application PCT/CN2019/099364, filed on Aug. 6, 2019 which claims priority to Chinese Patent Application No. 201910615186.4, titled "MODULE SWITCHOFF DEVICE AND SECURITY PROTECTION SYSTEM OF PHOTOVOLTAIC POWER GENERATION SYSTEM", filed on Jul. 9, 2019 with the China National Intellectual Property Administration, both of which are incorporated herein by reference in their entireties.

FIELD

The present disclosure relates to the technical field of safety protection for a photovoltaic power generation system, and in particular to a module shutdown device and a safety protection system for a photovoltaic power generation system.

BACKGROUND

Since solar energy is renewable and clean, photovoltaic grid-connected power generation technology has developed rapidly. Generally, a photovoltaic power generation system includes multiple photovoltaic modules connected in series to form a string, and an inverter which is connected with the string to convert direct current into alternating current and output the current into a grid.

The photovoltaic modules connected in series generate high-voltage direct current power which may result in safety hazards and fire accidents. In a field photovoltaic system, an arc protection device requires to be provided on the inverter. That is, the inverter stops operating immediately when an arc is detected. However, even if the inverter stops operating, a direct current cable of the photovoltaic modules connected in series may still output power with a high voltage, resulting in safety hazards. Therefore, the safest approach is to shut down a voltage outputted by each of the multiple photovoltaic modules so as to completely avoid the high-voltage direct current power as much as possible. Reference is made to FIG. 1, which is a schematic structural diagram showing a system for eliminating high-voltage direct current power output by photovoltaic modules. Each of the photovoltaic modules is connected to a shutdown device. Output terminals of the shutdown devices are connected in series to form a branch, and then the branch is connected to an inverter. A controlled is used to control switches in the shutdown devices to be switched off, so that a voltage on the direct current cable is low. In this way, the high-voltage direct current power is completely avoided as much as possible.

Reference is made to FIG. 2, which is a schematic structural diagram showing an existing shutdown device. A MOS transistor serves as a switch device M1, and is connected in series in the shutdown device. A communication module performs sampling to obtain a control signal and sends the control signal to a control module. The control module controls the switch device M1 to be switched on or off, so as to conduct or block a voltage outputted by the photovoltaic module. However, when the photovoltaic power generation system operates normally, the switch device M1 is on. In this case, a current generated by the photovoltaic module flows to the inverter through the switch device M1. The on-resistance of the switch device M1 may consume the current of the photovoltaic module, so as to reduce generating capacity of the photovoltaic power generation system.

In summary, a technical problem urgently to be solved by those skilled in the art is how to reduce the power loss caused by the shutdown device in a normal operation process of the photovoltaic power generation system thereby increasing the generating capacity of the photovoltaic power generation system.

SUMMARY

In view of this, a module shutdown device and a safety protection system for a photovoltaic power generation system are provided according to the present disclosure, to reduce the power loss caused by the shutdown device in a normal operation process of the photovoltaic power generation system and increase generating capacity of the photovoltaic power generation system.

The following technical solutions are provided to solve the above technical problem.

A module shutdown device includes:
- a switch transistor, where the switch transistor includes: a first terminal connected to a positive input terminal of the module shutdown device, and a second terminal connected to a negative input terminal of the module shutdown device, where the positive input terminal and the negative input terminal of the module shutdown device are configured to connect with a photovoltaic module;
- a driving module connected to a control terminal of the switch transistor; and
- a power supply module connected to the driving module and an output terminal of the module shutdown device, where the output terminal of the module shutdown device is configured to connect to a controller; the controller is configured to: send, in order to control the photovoltaic module to output a voltage normally, a first control signal to control the switch transistor to be switched off; and send, in order to stop the photovoltaic module outputting the voltage, a second control signal to control the switch transistor to be switched on; and the power supply module is configured to convert the control signal sent by the controller to supply power to the driving module.

In an embodiment, the module shutdown device includes a plurality of switch transistors connected in series.

In an embodiment, the module shutdown device includes a plurality of switch transistors connected in parallel.

In an embodiment, the driving module is connected to the positive input terminal and the negative input terminal of the module shutdown device.

In an embodiment, the module shutdown device further includes an inductor connected to the power supply module and arranged on a line provided with the output terminal of the module shutdown device.

In an embodiment, the module shutdown device further includes a magnetic ring connected to the power supply module and coupled with a line provided with the output terminal of the module shutdown device.

In an embodiment, the switch transistor is a PMOS transistor. A source of the PMOS transistor serves as the first terminal of the switch transistor, a drain of the PMOS transistor serves as the second terminal of the switch transistor, and a gate of the PMOS transistor serves as the control terminal of the switch transistor.

In an embodiment, the switch transistor is a PNP triode. A base of the PNP triode serves as the control terminal of the switch transistor, an emitter of the PNP triode serves as the first terminal of the switch transistor, and a collector of the PNP triode serves as the second terminal of the switch transistor.

In an embodiment, the module shutdown device further includes a resistor connected in series with the switch transistor.

A safety protection system for a photovoltaic power generation system includes the module shutdown device as described above, a photovoltaic module connected to an input terminal of the module shutdown device, and a controller connected to the output terminal of the module shutdown device.

A module shutdown device and a safety protection system for a photovoltaic power generation system are provided according to the present disclosure. The module shutdown device includes a switch transistor. The switch transistor includes: a first terminal connected to a positive input terminal of the module shutdown device and a second terminal connected to a negative input terminal of the module shutdown device. The positive input terminal and the negative input terminal of the module shutdown device are configured to connect with a photovoltaic module. The module shutdown device further includes a driving module connected to a control terminal of the switch transistor; and a power supply module connected to the driving module and an output terminal of the module shutdown device. The output terminal of the module shutdown device is configured to connect to a controller; the controller is configured to send, in order to control the photovoltaic module to output a voltage normally, a first control signal to control the switch transistor to be switched off, and send, in order to stop the photovoltaic module outputting a voltage, a second control signal to control the switch transistor to be switched on. The power supply module is configured to convert the control signal sent by the controller to supply power to the driving module.

According to the above technical solutions provided in the present disclosure, the switch transistor is connected in parallel to the input terminals of the module shutdown device. The switch transistor is controlled to be switched on or off by the controller, the power supply module, and the driving module. When the photovoltaic module needs output a voltage normally, the switch transistor is controlled to be switched off, so that the module shutdown device is switched on. When the photovoltaic module does not need output a voltage, the switch transistor is controlled to be switched on, so that the module shutdown device is switched off. Thus, the module shutdown device is used to control a normal operation or a shutdown of the photovoltaic module. In a process of controlling the normal operation or the shutdown of the photovoltaic module, the switch transistor is off when the photovoltaic module outputs the voltage normally, and thus the current generated by the photovoltaic module does not pass through the switch transistor. In this way, the power loss caused by the module shutdown device in the normal operation process of the photovoltaic power generation system is reduced, thereby increasing the generating capacity of the photovoltaic power generation system.

BRIEF DESCRIPTION OF THE DRAWINGS

In order to more clearly illustrate technical solutions in embodiments of the present disclosure or in the conventional technology, the drawings to be used in the description of the embodiments or the conventional technology are briefly described below. It is apparent that the drawings in the following description show only some embodiments of the present disclosure, and other drawings may be obtained by those skilled in the art from the drawings without any creative work.

DETAILED DESCRIPTION OF THE EMBODIMENTS

The technical solutions in the embodiments of the present disclosure are described clearly and completely in conjunction with the drawings in the embodiments of the present disclosure hereinafter. It is apparent that the described embodiments are only some rather than all embodiments of the present disclosure. All other embodiments obtained by those skilled in the art based on the embodiments of the present disclosure without any creative work fall within the protection scope of the present disclosure.

Figure 1:
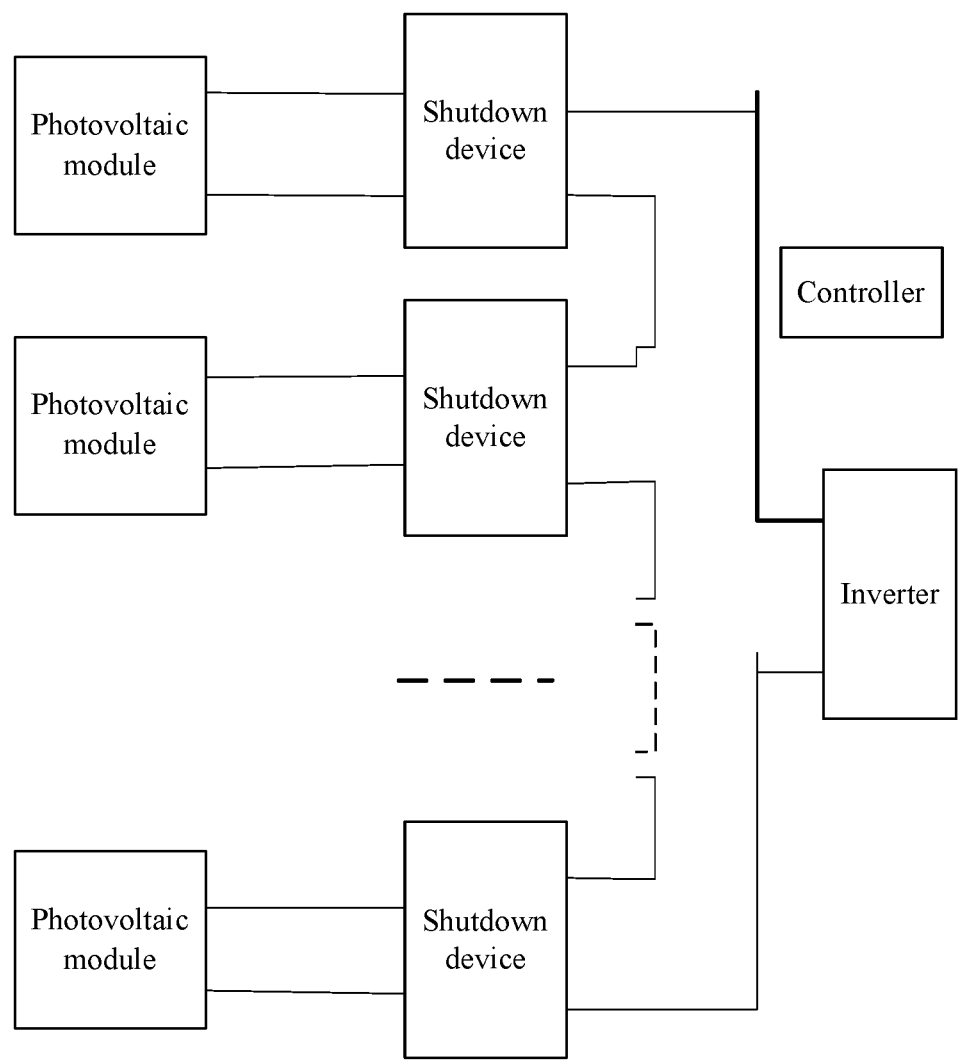
FIG. 1 is a schematic structural diagram showing a system for eliminating high-voltage direct current power output by photovoltaic modules.
Figure 2:
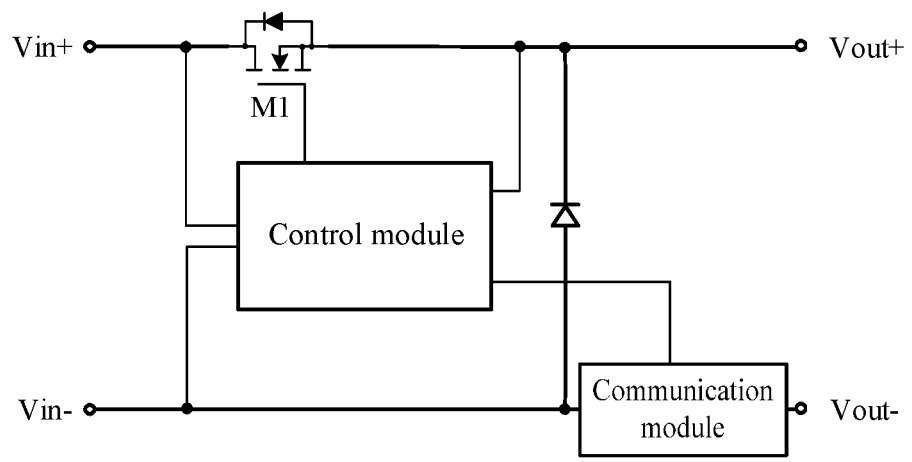
FIG. 2 is a schematic structural diagram showing an existing shutdown device.
Figure 3:
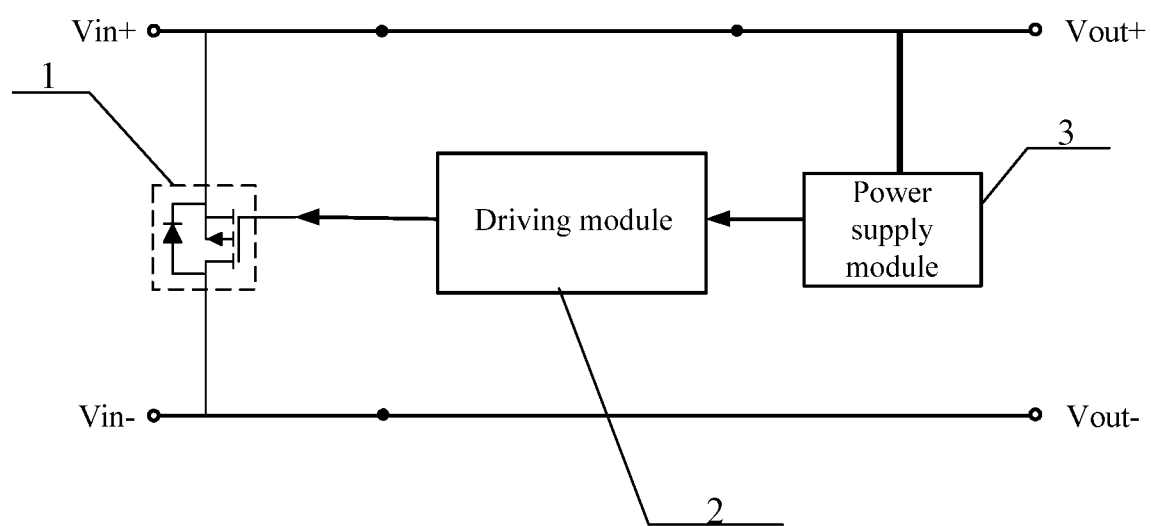
FIG. 3 is a schematic structural diagram showing a module shutdown device according to an embodiment of the present disclosure.

Reference is made to FIG. 3, which is a schematic structural diagram showing a module shutdown device according to an embodiment of the present disclosure. The module shutdown device includes: a switch transistor 1, a driving module 2 and a power supply module 3.

The switch transistor 1 have a first terminal connected to a positive input terminal Vin+ of the module shutdown device, and a second terminal connected to a negative input terminal Vin− of the module shutdown device. The positive input terminal Vin+ and the negative input terminal Vin− of the module shutdown device are configured to connect with a photovoltaic module.

The driving module 2 is connected to a control terminal of the switch transistor 1.

The power supply module 3 is connected to the driving module 2 and an output terminal of the module shutdown device. The output terminal of the module shutdown device is connected to a controller. The controller is configured to send, in order to control the photovoltaic module to output a voltage normally, a first control signal to control the switch transistor 1 to be switched off; and send, in order to stop the photovoltaic module outputting the voltage, a second control signal to control the switch transistor 1 to be switched on.

The power supply module 3 is configured to convert the control signal sent by the controller to supply power to the driving module 2.

The module shutdown device includes the switch transistor 1, the driving module 2, and the power supply module 3.

The first terminal of the switch transistor 1 is connected to the positive input terminal Vin+ of the module shutdown device. The second terminal of the switch transistor 1 is connected to the negative input terminal Vin− of the module shutdown device. The control terminal of the switch transistor 1 is connected to the driving module 2. The positive input terminal Vin+ of the module shutdown device is configured to connect with a positive output terminal of the photovoltaic module, and the negative input terminal Vin− of the module shutdown device is configured to connect a negative input terminal Vin− of the photovoltaic module. The driving module 2 is connected to the power supply module 3, so that the power supply module 3 supplies power to the driving module 2. Therefore, the driving module 2 generates a driving signal to control the switch transistor 1. The power supply module 3 is connected to the output terminal of the module shutdown device. The output terminal of the module shutdown device includes a positive output terminal Vout+ and a negative output terminal Vout−, and the power supply module 3 may be connected to the positive output terminal Vout+. The output terminal of the module shutdown device is further used to be connected in series with another module shutdown device, and to be connected to the controller and an inverter. The inverter is configured to convert direct current power outputted by the photovoltaic module into alternating current power. The controller is configured to control the switch transistor 1 to be switched off or on, so as to control the module shutdown device to be switched on or off. In an embodiment, the controller sends a control signal (for example, a pulse signal) to the inside of the module shutdown device. The power supply module 3 in the module shutdown device receives the control signal and converts the control signal so as to supply power to the driving module 2. The driving module 2 generates a driving signal under driving of the power supply module 2, to control the switch transistor 1. It should be noted that the controller may be integrated in the inverter (that is, the inverter and the controller are integrated in structure), or arranged outside the inverter (that is, the inverter is separate from the controller).

Figure 4:
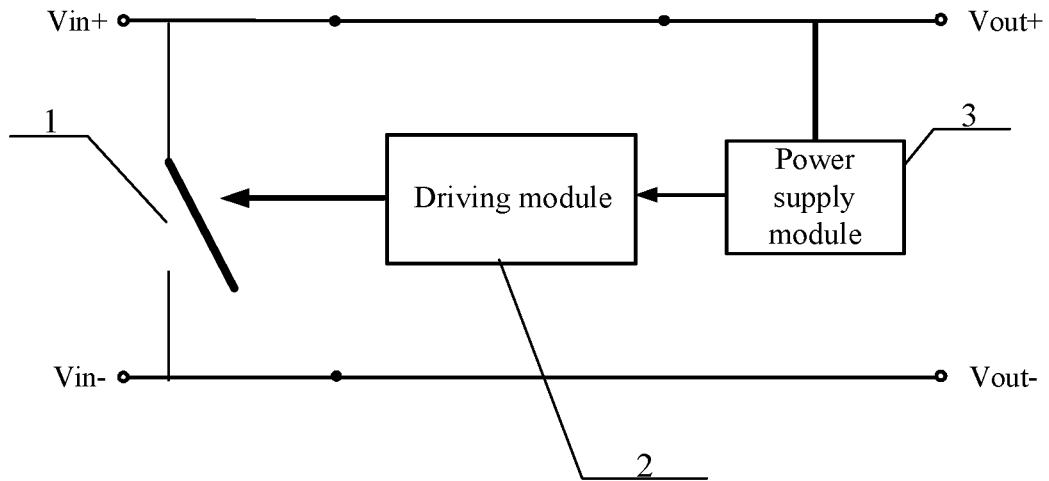
FIG. 4 is a schematic structural diagram showing a switch transistor in an off state according to an embodiment of the present disclosure.

In the case that the module shutdown device is applied to a photovoltaic power generation system, when no arc is generated in the photovoltaic power generation system or it is unnecessary to shut down the photovoltaic power generation system for maintenance and other operations, the photovoltaic module is controlled to output a voltage normally. In this case, the controller sends, to the inside of the module shutdown device, a command for driving the module shutdown device to be switched on (that is, a command for controlling the switch transistor 1 to be switched off, which is the first control signal as mentioned above). The power supply module 3 and the driving module 2 perform corresponding actions to control the switch transistor 1 to be off. Reference is made to FIG. 4, which is a schematic structural diagram showing a switch transistor in an off state according to an embodiment of the present disclosure. The switch transistor 1 is off, and the module shutdown device is on. Correspondingly, the photovoltaic module connected to the module shutdown device is controlled to operate normally, and the voltage and the current may pass through the module shutdown device to the inverter normally. When the photovoltaic module outputs a voltage normally, the voltage and the current outputted by the photovoltaic module does not pass through the switch transistor 1. Therefore, the switch transistor 1 does not consume the power generated by the photovoltaic module. In this way, the power loss caused by the module shutdown device in the normal operation process of the photovoltaic power generation system is reduced, thereby increasing the generating capacity of the photovoltaic power generation system.

Figure 5:
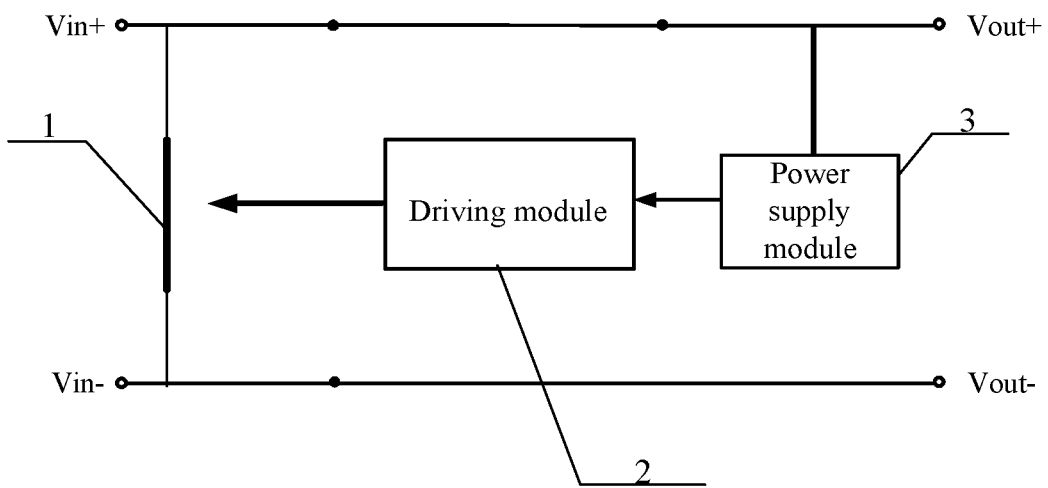
FIG. 5 is a schematic structural diagram showing a switch transistor in an on state according to an embodiment of the present disclosure.

In the case that an arc is detected in the photovoltaic power generation system or the photovoltaic module is to be stopped from outputting a voltage so as to perform operations such as maintenance on the photovoltaic power generation system, the photovoltaic module is stopped outputting a voltage so as to avoid a safety accident. In this case, the controller sends, to the inside of the module shutdown device, a command for driving the module shutdown device to be switched off (that is, a command for controlling the switching transistor 1 to be switched on, which is the second control signal mentioned above). The power supply module 3 and the driving module 2 perform a corresponding action in response to the command to make the switch transistor 1 in an on state. Reference is made to FIG. 5, which is a schematic structural diagram showing a switch transistor in an on state according to an embodiment of the present disclosure. In this case, the switching transistor 1 is in the on state, and thus the output of the photovoltaic module is short-circuited. Thus, the voltage outputted by the photovoltaic module is zero. That is, the module shutdown device is in the off state to avoid hazards caused by the high-voltage direct power, thereby improving the safety of the photovoltaic power generation system.

It can be seen from the above, with the module shutdown device having the above structure, not only the photovoltaic module is stopped outputting a voltage or is controlled to output a voltage normally so as to ensure the safety of the photovoltaic power generation system, but also the power loss caused by the module shutdown device in the normal operation process of the photovoltaic power generation system is reduced, thereby increasing the generating capacity of the photovoltaic power generation system.

In addition, it should be noted that the switch transistor 1 may include a body diode. The body diode serves as a bypass diode for the photovoltaic module. Alternatively, a bypass diode is arranged outside the switch transistor 1 and is connected in parallel to the switch transistor 1, which serves as a bypass diode for the photovoltaic module.

According to the above technical solutions described in the present disclosure, the switch transistor is connected in parallel to the input terminals of the module shutdown device. The switch transistor is controlled to be switched on or off by the controller, the power supply module, and the driving module. When the photovoltaic module needs output a voltage normally, the switch transistor is controlled to be switched off, so that the module shutdown device is switched on. When the photovoltaic module does not need output a voltage, the switch transistor is controlled to be switched on, so that the module shutdown device is switched off. Thus, the module shutdown device is used to control a normal operation or a shutdown of the photovoltaic module. In a process of controlling the normal operation or the shutdown of the photovoltaic module, the switch transistor is off when the photovoltaic module outputs the voltage normally, and thus the current generated by the photovoltaic module does not pass through the switch transistor. In this way, the power loss caused by the module shutdown device in the normal operation process of the photovoltaic power generation system is reduced, thereby increasing the generating capacity of the photovoltaic power generation system.

The module shutdown device according to an embodiment of the present disclosure includes multiple switch transistors 1 connected in series.

The module shutdown device may include multiple switch transistors 1 connected in series. In an embodiment, each of the multiple switch transistors 1 has a control terminal connected to the driving module 2. A first terminal of the first switch transistor 1 among the multiple switch transistors 1 is connected to the positive input terminal Vin+ of the module shutdown device. A second terminal of the first switch transistor 1 is connected to a first terminal of the second switch transistor 1 among the multiple switch transistors 1. A second terminal of the second switch transistor 1 is connected to a first terminal of the third switch transistor 1 among the multiple switch transistors 1, and so on. A second terminal of the last switch transistor 1 among the multiple switch transistors 1 is connected to the negative input terminal Vin− of the module shutdown device.

With the multiple switch transistors 1 connected in series, reliability of on-off control of the module shutdown device is improved, so as to improve the safety of the operation of the photovoltaic power generation system.

The module shutdown device according to an embodiment of the present disclosure includes multiple switch transistors 1 connected in parallel.

The module shutdown device may include multiple switch transistors 1 connected in parallel. In an embodiment, each of the multiple switch transistors 1 has a control terminal connected to the driving module 2. The first terminals of the multiple switch transistors 1 are connected to the positive input terminal Vin+ of the module shutdown device, and the second terminals of multiple switch transistors 1 are connected to the negative input terminal Vin− of the module shutdown device. It should be noted that the multiple switch transistors 1 are in the same state in the process of controlling the module shutdown device to be on or off, so as to prevent the module shutdown device from being affected by different states of switch transistors 1, thereby avoiding malfunction.

The multiple switch transistors 1 are connected in parallel in the module shutdown device as a backup, to prevent a switch transistor 1 from being damaged in the operation process, thereby ensuring that the module shutdown device can normally control the photovoltaic module to be output or stop outputting the voltage.

Figure 6:
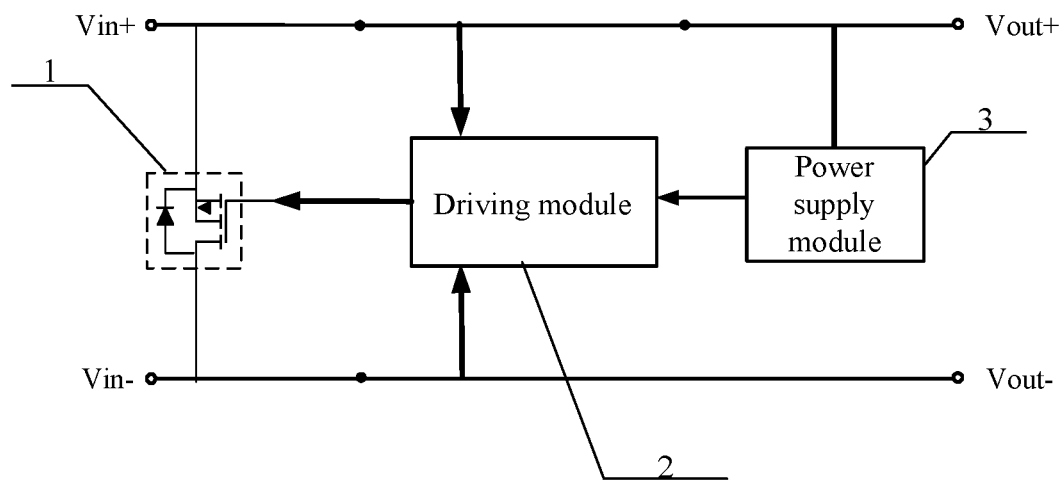
FIG. 6 is a schematic structural diagram showing a module shutdown device according to another embodiment of the present disclosure.

Reference is made to FIG. 6, which is a schematic structural diagram showing a module shutdown device according to another embodiment of the present disclosure. In the module shutdown device according to the embodiment of the present disclosure, the driving module 2 is connected to the positive input terminal Vin+ and the negative input terminal Vin− of the module shutdown device.

In addition to the power supply module 3, the input terminal of the module shutdown device also supplies power to the driving module 2. In an embodiment, the driving module 2 is connected to the positive input terminal Vin+ and the negative input terminal Vin− of the module shutdown device, so that the module shutdown device supplies power to the driving module 2 as follows.

In the on state of the switch transistor 1, the photovoltaic module is short-circuited by the switch transistor 1. A voltage supplied to the driving module 2 is 0, and the driving module 2 does not operate. When the controller sends a command for controlling the module shutdown device to be switched on, the switch transistor 1 is switched off under actions of the power supply module 3 and the driving module 2, and the photovoltaic module outputs a voltage normally. In this case, the driving module 2 is powered by the positive input terminal Vin+ and the negative input terminal Vin− of the module shutdown device, and operates normally. In this case, the voltage supplied by the driving module 2 is higher than a turn-off voltage of the switch transistor 1. Correspondingly, the switch transistor 1 keeps in the off state, and the photovoltaic module operates normally. In order to stop the photovoltaic module outputting a voltage, the controller sends a command for controlling the module shutdown device to be switched off, and the switch transistor 1 is switched on under actions of the power supply module 3 and the driving module 2. In this case, the photovoltaic module is short-circuited and fails to operate normally.

Figure 7:
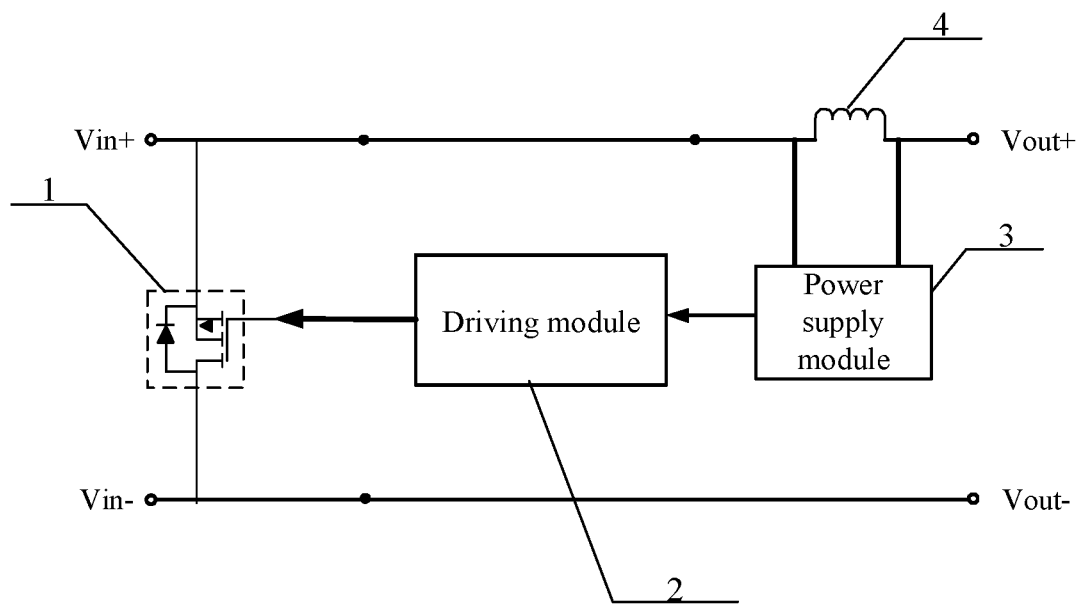
FIG. 7 is a schematic structural diagram showing a module shutdown device according to another embodiment of the present disclosure.

Reference is made to FIG. 7, which is a schematic structural diagram showing a module shutdown device according to another embodiment of the present disclosure. The module shutdown device according to the embodiment of the present disclosure further includes an inductor 4.

The inductor 4 is connected to the power supply module 3 and is arranged on a line provided with the output terminal of the module shutdown device.

The inductor 4 connected to the power supply module 3 is arranged on the line where the output terminal of the module shutdown device is arranged. For example, the inductor 4 is arranged on a line where the positive output terminal Vout+ is arranged. Thus, the inductor 4 supplies a voltage to the power supply module 3. When the controller sends a pulse signal as the command, the inductor 4 converts the pulse signal sent by the controller to supply a voltage to the power supply module 3, such that the power supply module 3 can supply power to the driving module 2.

Figure 8:
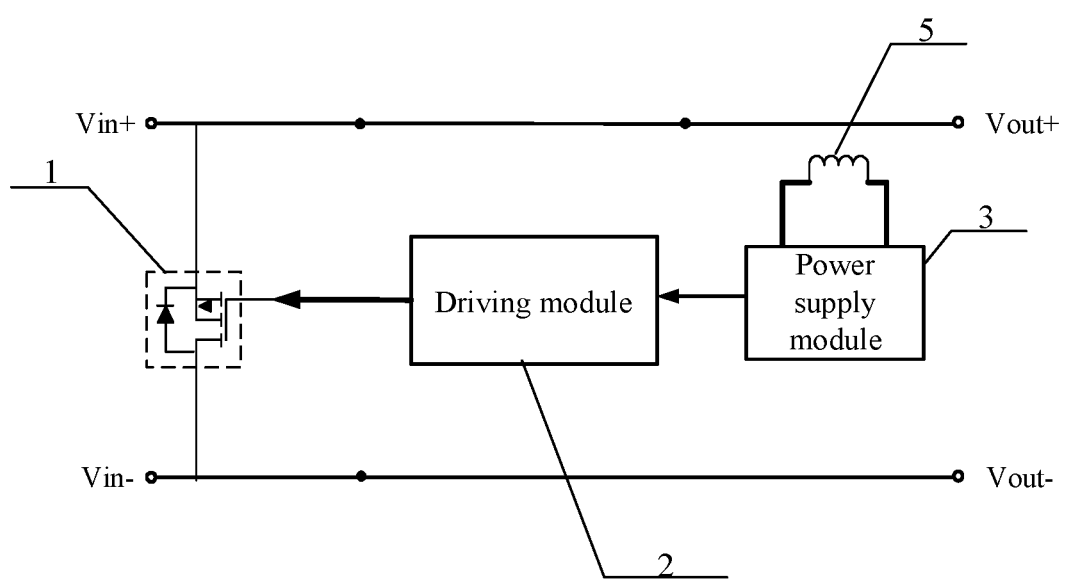
FIG. 8 is a schematic structural diagram showing a module shutdown device according to another embodiment of the present disclosure.

Reference is made to FIG. 8, which is a schematic structural diagram showing a module shutdown device according to another embodiment of the present disclosure. The module shutdown device according to the embodiment of the present disclosure further includes a magnetic ring 5.

The magnetic ring 5 is connected to the power supply module 3 and is coupled with the line provided with the output terminal of the module shutdown device.

Instead of the inductor 4, the magnetic ring 5 connected to the power supply module 3 and coupled with the line where the output terminal of the module shutdown device is arranged (for example, the magnetic ring 5 is coupled with a line where the positive output terminal Vout+ of the module shutdown device is arranged) converts the pulse signal sent by the controller, such that the power supply module 3 supplies power to the driving module 2.

In the module shutdown device according to an embodiment of the present disclosure, the switch transistor 1 is a PMOS transistor. The source of the PMOS transistor serves as the first terminal of the switch transistor 1, the drain of the PMOS transistor serves as the second terminal of the switch transistor 1, and the gate of the PMOS transistor serves as the control terminal of the switch transistor 1.

The switch transistor 1 included in the module shutdown device is a PMOS transistor. The source of the PMOS transistor serves as the first terminal of the switch transistor 1 and is connected to the positive input terminal Vin+ of the module shutdown device. The drain of the PMOS transistor serves as the second terminal of the switch transistor 1 and is connected to the negative input terminal Vin− of the module shutdown device. The gate of the PMOS transistor serves as the control terminal of the switch transistor 1 and is connected to the driving module 2. In this case, the controller outputs a pulse signal to control the switch transistor 1. In an embodiment, in order to stop the photovoltaic module outputting a voltage (that is, when the module shutdown device is in the off state and the switch transistor 1 is in the on state), the controller send no pulse signal to the inside of the module shutdown device. In this case, the power supply module 3 does not receive any input signal, and the driving module 2 does not generate a driving signal for the PMOS transistor. The PMOS transistor is in the on state and the module shutdown device is in the off state. In order to control the photovoltaic module to output a voltage normally (that is, when the module shutdown device is in the on state and the switch transistor 1 is in the off state), the controller may send a pulse signal to the inside of the module shutdown device. In this case, when receiving a signal from the output terminal of the module shutdown device, the power supply module 3 supplies power to the driving module 2, such that the driving module 2 generates a driving signal. The PMOS transistor is in the off state in response to the driving signal. Accordingly, the module shutdown device is in the on state.

Instead of the PMOS transistor, an NMOS also serves as the switch transistor 1. The drain of the NMOS transistor serves as the first terminal of the switch transistor 1, the source of the NMOS transistor serves as the second terminal of the switch transistor 1, and the gate of the NMOS transistor serves as the control terminal of the switch transistor. The controller sends a pulse signal to control the NOMS transistor to be switched on, and send no pulse signal to control the NMOS transistor to be switched off.

In the module shutdown device according to an embodiment of the present disclosure, the switch transistor 1 is a PNP triode. The base of the PNP triode serves as the control terminal of the switch transistor 1, the emitter of the PNP triode serves as the first terminal of the switch transistor 1, and the collector of the PNP triode serves as the second terminal of the switch transistor 1.

The switch transistor 1 in the module shutdown device may be the PNP triode. The base of the PNP triode serves as the control terminal of the switch transistor 1 and is connected to the driving module 2. The emitter of the PNP triode serves as the first terminal of the switch transistor 1 and is connected to the positive input terminal Vin+ of the module shutdown device. The collector of the PNP triode serves as the second terminal of the switch transistor 1 and is connected to the negative input terminal Vin− of the module shutdown device. A process for controlling the PNP triode to be on or off by the controller is similar to the process of controlling the PMOS transistor to be on or off, which will not be described in detail herein.

Alternatively, the switch transistor 1 is an NPN triode. A process for controlling the NPN transistor by the control is similar to the process of controlling the NMOS transistor to be on or off, which will not be described in detail herein.

Alternatively, the switch transistor 1 in the module shutdown device is a relay, an insulated gate bipolar transistor (IGBT), a thyristor or the other element which has the same function.

The module shutdown device according to an embodiment of the present disclosure further includes a resistor The resistor is connected in series to the switch transistor 1.

The resistor connected in series to the switch transistor 1 is arranged inside the module shutdown device, to perform voltage division when the switch transistor 1 is on. In this way, the voltage outputted by the photovoltaic module is prevented from being fully applied to the switch transistor 1, thereby avoiding damage to the switch transistor 1 and further improving the reliability of the switch transistor 1.

The resistor has fixed resistance or variable resistance. The resistance of the resistor depends on the voltage outputted by the photovoltaic module and a parameter of the switch transistor 1.

A safety protection system for a photovoltaic power generation system is further provided according to an embodiment of the present disclosure. The safety protection system includes the module shutdown device according to any one of the above embodiments, a photovoltaic module connected to the input terminal of the module shutdown device, and a controller connected to the output terminal of the module shutdown device.

The safety protection system for the photovoltaic power generation system includes the module shutdown device according to any one of the above embodiments, the photovoltaic module connected to the positive input terminal Vin+ and the negative input terminal Vin− of the module shutdown device, and the controller connected to the input terminal of the module shutdown device. The module shutdown device is further connected in series to another module shutdown device by the output terminal thereof, so as to connect the photovoltaic modules in series. The controller is configured to control the module shutdown device to be on or off, so as to control the photovoltaic module to output a voltage normally in the case of no abnormal condition or if it is unnecessary to shut down the photovoltaic module for maintenance, and stop the photovoltaic module outputting a voltage in the case of an abnormal condition or if the photovoltaic module is to be shut down for maintenance. In this way, the safety of the operation of photovoltaic power generation system is ensured. In addition, the switch transistor 1 in the module shutdown device is in the off state when the photovoltaic module normally outputs a voltage. Therefore, the power loss caused by the module shutdown device in the normal operation process of the photovoltaic power generation system is reduced, and the generating capacity of the photovoltaic power generation system is increased.

The description of the relevant parts of the safety protection system for the photovoltaic power generation system according to the embodiment of the present disclosure may refer to the detailed description of the corresponding part of the module shutdown device according to the embodiments of the present disclosure, which will not described in detail herein.

It should be noted that the relationship terminologies such as first, second or the like are only used herein to distinguish one entity or operation from another, rather than to necessitate or imply that the actual relationship or order exists between the entities or operations. Furthermore, terms of "include", "comprise" or any other variants are intended to be non-exclusive. Therefore, a process, method, article or device including a series of elements includes not only these elements but also other elements that are not enumerated, or also includes an element inherent for the process, method, article or device. Unless expressively limited otherwise, the statement "comprising (including) one . . . " does not exclude the case that the process, method, article or device includes another similar element. In addition, the parts in the above technical solutions according to the embodiments of the present disclosure that are similar to the principles of the related technical solutions in the conventional technology are not described in detail herein, so as to avoid repetition.

Based on the above description of the disclosed embodiments, those skilled in the art can implement or carry out the present disclosure. Those skilled in the art can easily think of various modifications to the disclosed embodiments, and the general principles defined herein may be implemented in other embodiments without departing from the spirit or scope of the present disclosure. Therefore, the present disclosure should not be limited to the embodiments described herein, but conforms to the widest scope that complies with the principles and novelty disclosed herein.

The invention claimed is:

1. A module shutdown device, comprising:
a switch transistor, wherein the switch transistor comprises: a first terminal connected to a positive input terminal of the module shutdown device; and a second terminal connected to a negative input terminal of the module shutdown device, wherein the positive input terminal and the negative input terminal of the module shutdown device are configured to connect with a photovoltaic module;
a driving module connected to a control terminal of the switch transistor; and
a power supply module connected to the driving module and an output terminal of the module shutdown device, wherein the output terminal of the module shutdown device is configured to connect to a controller; the controller is configured to send, in order to control the photovoltaic module to output a voltage normally, a first control signal to control the switch transistor to be switched off, and send, in order to stop the photovoltaic module outputting a voltage, a second control signal to control the switch transistor to be switched on; and the power supply module is configured to convert the control signal sent by the controller to supply power to the driving module.

2. The module shutdown device according to claim 1, wherein the module shutdown device comprises a plurality of switch transistors connected in series.

3. The module shutdown device according to claim 1, wherein the module shutdown device comprises a plurality of switch transistors connected in parallel.

4. The module shutdown device according to claim 1, wherein the driving module is connected to the positive input terminal and the negative input terminal of the module shutdown device.

5. The module shutdown device according to claim 4, further comprising:
an inductor connected to the power supply module and arranged on a line provided with the output terminal of the module shutdown device.

6. The module shutdown device according to claim 4, further comprising:
a magnetic ring connected to the power supply module and coupled with a line provided with the output terminal of the module shutdown device.

7. The module shutdown device according to claim 4, wherein the switch transistor is a PMOS transistor, and wherein a source of the PMOS transistor serves as the first terminal of the switch transistor, a drain of the PMOS transistor serves as the second terminal of the switch transistor, and a gate of the PMOS transistor serves as the control terminal of the switch transistor.

8. The module shutdown device according to claim 4, wherein the switch transistor is a PNP triode, and wherein a base of the PNP triode serves as the control terminal of the switch transistor, an emitter of the PNP triode serves as the first terminal of the switch transistor, and a collector of the PNP triode serves as the second terminal of the switch transistor.

9. The module shutdown device according to claim 1, further comprising:
a resistor connected in series with the switch transistor.

10. A safety protection system for a photovoltaic power generation system, comprising:
a module shutdown device, wherein the module shutdown device comprises:
a switch transistor, wherein the switch transistor comprises: a first terminal connected to a positive input terminal of the module shutdown device; and a second terminal connected to a negative input terminal of the module shutdown device, wherein the positive input terminal and the negative input terminal of the module shutdown device are configured to connect with a photovoltaic module;
a driving module connected to a control terminal of the switch transistor; and
a power supply module connected to the driving module and an output terminal of the module shutdown device, wherein the output terminal of the module shutdown device is configured to connect to a controller; the controller is configured to send, in order to control the photovoltaic module to output a voltage normally, a first control signal to control the switch transistor to be switched off, and send, in order to stop the photovoltaic module outputting a voltage, a second control signal to control the switch transistor to be switched on; and the power supply module is configured to convert the control signal sent by the controller to supply power to the driving module;
the photovoltaic module connected to an input terminal of the module shutdown device; and
a controller connected to the output terminal of the module shutdown device.

11. The safety protection system according to claim 10, wherein the module shutdown device comprises a plurality of switch transistors connected in series.

12. The safety protection system according to claim 10, wherein the module shutdown device comprises a plurality of switch transistors connected in parallel.

13. The safety protection system according to claim 10, wherein the driving module is connected to the positive input terminal and the negative input terminal of the module shutdown device.

14. The safety protection system according to claim 13, wherein the module shutdown device further comprises:
an inductor connected to the power supply module and arranged on a line provided with the output terminal of the module shutdown device.

15. The safety protection system according to claim 13, wherein the module shutdown device further comprises:
a magnetic ring connected to the power supply module and coupled with a line provided with the output terminal of the module shutdown device.

16. The safety protection system according to claim 13, wherein the switch transistor is a PMOS transistor, and wherein a source of the PMOS transistor serves as the first terminal of the switch transistor, a drain of the PMOS transistor serves as the second terminal of the switch transistor, and a gate of the PMOS transistor serves as the control terminal of the switch transistor.

17. The safety protection system according to claim 13, wherein the switch transistor is a PNP triode, and wherein a base of the PNP triode serves as the control terminal of the switch transistor, an emitter of the PNP triode serves as the first terminal of the switch transistor, and a collector of the PNP triode serves as the second terminal of the switch transistor.

18. The safety protection system according to claim 10, wherein the module shutdown device further comprises:
  a resistor connected in series with the switch transistor.

\* \* \* \* \*